United States Patent
Ma et al.

(10) Patent No.: US 11,315,882 B2
(45) Date of Patent: Apr. 26, 2022

(54) ALIGNMENT MARK, SUBSTRATE AND MANUFACTURING METHOD THEREFOR, AND EXPOSURE ALIGNMENT METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Qinglin Ma, Beijing (CN); Baojie Zhao, Beijing (CN); Conghui Zhou, Beijing (CN); Li Wang, Beijing (CN); Jian Li, Beijing (CN); Yan Zhao, Beijing (CN); Xiang Hui, Beijing (CN); Xiongwei Wang, Beijing (CN); Chunhong Ma, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 171 days.

(21) Appl. No.: 16/634,741

(22) PCT Filed: Sep. 7, 2018

(86) PCT No.: PCT/CN2018/104655
§ 371 (c)(1),
(2) Date: Jan. 28, 2020

(87) PCT Pub. No.: WO2019/105098
PCT Pub. Date: Jun. 6, 2019

(65) Prior Publication Data
US 2020/0201168 A1  Jun. 25, 2020

(30) Foreign Application Priority Data

Nov. 30, 2017 (CN) .......................... 201711242791.9

(51) Int. Cl.
*H01L 23/544* (2006.01)
*G03F 1/40* (2012.01)
(Continued)

(52) U.S. Cl.
CPC .............. *H01L 23/544* (2013.01); *G03F 1/40* (2013.01); *G03F 1/42* (2013.01); *G03F 9/7088* (2013.01);
(Continued)

(58) Field of Classification Search
CPC . H01L 23/544; H01L 2223/544–54493; H01L 2223/54426; G03F 1/42; G03F 9/7073–7084; B81C 99/007
See application file for complete search history.

(56) References Cited

U.S. PATENT DOCUMENTS 3,607,267 A * 9/1971 Garrels .................. H01L 21/00
430/5
4,343,877 A * 8/1982 Chiang ............... G03F 7/70541
257/48

(Continued)

FOREIGN PATENT DOCUMENTS

CN       1496495 A      5/2004
CN     101271281 A      9/2008
(Continued)

OTHER PUBLICATIONS

Machine translation of WO-2014134888-A1, (Tian et al.), published on Sep. 12, 2014.*
(Continued)

*Primary Examiner* — Scott B Geyer
(74) *Attorney, Agent, or Firm* — McDermott Will & Emery LLP

(57) ABSTRACT

An alignment mark includes an alignment region, a peripheral region and a shielding region. The alignment region has
(Continued)

an outer contour; the peripheral region is disposed around at least a part of the outer contour of the alignment region; the shielding region is disposed around at least a part of the outer contour of the alignment region and is non-overlapped with the peripheral region; and the alignment region and the shielding region are opaque, and the peripheral region is at least partially transparent.

13 Claims, 7 Drawing Sheets

(51) Int. Cl.
*G03F 1/42* (2012.01)
*G03F 9/00* (2006.01)
(52) U.S. Cl.
CPC ............. *H01L 2223/5442* (2013.01); *H01L 2223/54426* (2013.01); *H01L 2223/54493* (2013.01)

(56) References Cited

U.S. PATENT DOCUMENTS

| | | | | | |
|---|---|---|---|---|---|
| 4,423,127 | A * | 12/1983 | Fujimura | ............. | G03F 9/7084 257/E21.211 |
| 5,412,285 | A * | 5/1995 | Komatsu | ............. | B82Y 10/00 313/309 |
| 5,858,588 | A * | 1/1999 | Chang | ............. | H01L 23/544 430/22 |
| 5,952,134 | A * | 9/1999 | Hwang | ............. | H01L 22/34 430/22 |
| 6,671,049 | B1 * | 12/2003 | Silver | ............. | G03F 9/7076 356/399 |
| 6,801,313 | B1 * | 10/2004 | Yokota | ............. | H01L 23/544 356/401 |
| 6,812,933 | B1 * | 11/2004 | Silver | ............. | G03F 9/7076 345/419 |
| 8,220,140 | B1 * | 7/2012 | Wang | ............. | G11B 5/105 29/737 |
| 2002/0036356 | A1 * | 3/2002 | Teshima | ............. | H01L 23/544 257/797 |
| 2002/0132174 | A1 | 9/2002 | Pierrat | | |
| 2003/0081188 | A1 * | 5/2003 | Suzuki | ............. | G03F 7/2026 355/51 |
| 2003/0164353 | A1 * | 9/2003 | Tsubata | ............. | G03F 7/70633 216/2 |
| 2004/0000729 | A1 * | 1/2004 | Inomata | ............. | H01L 23/544 257/797 |
| 2004/0140484 | A1 * | 7/2004 | Nelson | ............. | H01L 21/31053 257/208 |
| 2005/0213458 | A1 * | 9/2005 | Iwase | ............. | H01L 23/544 369/53.35 |
| 2005/0250291 | A1 * | 11/2005 | Baluswamy | ............. | G03F 9/708 438/401 |
| 2007/0040286 | A1 * | 2/2007 | Liu | ............. | H01L 24/83 257/797 |
| 2007/0146587 | A1 | 6/2007 | Tsai | | |
| 2008/0217794 | A1 * | 9/2008 | Smith | ............. | G03F 7/70633 257/797 |
| 2008/0225254 | A1 * | 9/2008 | Komine | ............. | G03F 7/70633 355/53 |
| 2009/0246891 | A1 * | 10/2009 | Sato | ............. | G03F 9/7084 438/14 |
| 2009/0269862 | A1 * | 10/2009 | Tanemura | ............. | H01L 23/544 438/7 |
| 2009/0312981 | A1 * | 12/2009 | Saito | ............. | H01L 23/544 702/150 |
| 2012/0202138 | A1 * | 8/2012 | Lam | ............. | G03F 7/70475 430/5 |
| 2013/0136852 | A1 * | 5/2013 | Riedel | ............. | H05K 3/06 427/58 |
| 2015/0287651 | A1 * | 10/2015 | Ning | ............. | G03F 7/70633 257/797 |
| 2015/0362770 | A1 * | 12/2015 | Yang | ............. | G02F 1/133512 349/42 |
| 2016/0172306 | A1 * | 6/2016 | Scanlan | ............. | H01L 21/561 438/462 |
| 2017/0117227 | A1 * | 4/2017 | Lin | ............. | H01L 23/544 |
| 2017/0192143 | A1 * | 7/2017 | Xiong | ............. | G02B 5/201 |
| 2017/0263564 | A1 * | 9/2017 | Kim | ............. | H01L 51/0012 |
| 2018/0069710 | A1 * | 3/2018 | De Langen | ............. | G09C 5/00 |
| 2018/0226353 | A1 * | 8/2018 | Tangpattanasaeree | ............. | H01L 23/544 |
| 2019/0131248 | A1 * | 5/2019 | Kong | ............. | G06K 19/06009 |
| 2019/0206803 | A1 * | 7/2019 | Kodama | ............. | H01L 23/544 |
| 2019/0259884 | A1 * | 8/2019 | Fukuda | ............. | H01L 31/022433 |

FOREIGN PATENT DOCUMENTS

| | | | |
|---|---|---|---|
| CN | 101286010 | A | 10/2008 |
| CN | 203720532 | U | 7/2014 |
| CN | 104503203 | A | 4/2015 |
| CN | 105182697 | A | 12/2015 |
| CN | 106054543 | A | 10/2016 |
| CN | 106569390 | A | 4/2017 |
| KR | 10-2006-0110022 | A | 10/2006 |
| WO | WO-2014134888 | A1 * | 9/2014 ............. H01L 21/64 |

OTHER PUBLICATIONS

International Search Report and Written Opinion issued in corresponding International Application No. PCT/CN2018/104655, dated Dec. 7, 2018, with English language translation.
First Office Action issued in corresponding Chinese Application No. 201711242791.9, dated Oct. 29, 2019, with English lanugage translation.
Second Office Action issued in corresponding Chinese Application No. 201711242791.9, dated Jul. 3, 2020, with English lanugage translation.

* cited by examiner

A base substrate is provided, and the base substrate includes a working region and a non-working region located at a periphery of the working region.

An opaque film layer is formed on the base substrate.

The opaque film layer is patterned to form an alignment region and a shielding region of the alignment mark.

FIG. 7

A base substrate is provided, and the base substrate includes a working region and a non-working region located at a periphery of the working region.

An opaque film layer is formed on the base substrate.

The opaque film layer is patterned to form an alignment region and a shielding region of the alignment mark, and black matrixes are simultaneously formed through the patterning process.

FIG. 8

ALIGNMENT MARK, SUBSTRATE AND MANUFACTURING METHOD THEREFOR, AND EXPOSURE ALIGNMENT METHOD

CROSS-REFERENCE TO RELATED APPLICATIONS

This application is a national phase entry under 35 USC 371 of International Patent Application No. PCT/CN2018/1104655 filed on Sep. 7, 2018, which claims priority to Chinese Patent Application No. 201711242791.9 filed on Nov. 30, 2017, the contents of which are incorporated herein by reference to be a part of this application.

TECHNICAL FIELD

At least one embodiment of the present disclosure relates to an alignment mark, a substrate and a method of manufacturing the same, and an exposure alignment method.

BACKGROUND

In an exposure procedure of the photolithography process, an exposure machine and a mask are generally cooperatively used. In this procedure, the mask needs to be aligned with an object to be processed, such as a substrate, and then the exposure machine emits a light beam which will pass through the mask to expose the photoresist coated on a surface of the object to be processed. For alignment, one or more alignment marks generally need to be provided or formed on both the substrate and the mask plate, so as to align the substrate with the mask plate.

SUMMARY

At least one embodiment of the present disclosure provides an alignment mark, and the alignment mark includes an alignment region, a peripheral region, and a shielding region. The alignment region has an outer contour. The peripheral region is disposed around at least a part of the outer contour of the alignment region. The shielding region is disposed around at least a part of the outer contour of the alignment region and is non-overlapped with the peripheral region. The alignment region and the shielding region are opaque, and the peripheral region is at least partially transparent.

For example, in the alignment mark, the alignment region is in a shape of a polygon.

For example, in the alignment mark, the alignment region is in a shape of a rectangle.

For example, in the alignment mark, the peripheral region includes a plurality of strip structures, and the plurality of strip structures respectively extend along extending directions of sides of the outer contour of the alignment region, and lengths of the plurality of strip structures are each greater than a length of a corresponding side of the alignment region.

For example, in the alignment mark, the alignment region is in a shape of a circle.

For example, in the alignment mark, the peripheral region is in a shape of a ring, and a shape of a contour of the ring is same as a shape of the outer contour of the alignment region.

For example, in the alignment mark, the peripheral region includes a plurality of strip structures, and the plurality of strip structures respectively extend along tangential directions of the alignment region, and lengths of the plurality of strip structures are each greater than a diameter of the alignment region.

For example, in the alignment mark, materials of the alignment region and the shielding region are photosensitive materials.

For example, a portion of the peripheral region disposed around the outer contour of the alignment region is at least partially surrounded by the shielding region.

At least one embodiment of the present disclosure further provides a substrate, and the substrate includes a base substrate, an alignment region and a shielding region. The base substrate includes a peripheral region; the alignment region is disposed on a side of the base substrate and having an outer contour, and the peripheral region is disposed around at least a part of the outer contour of the alignment region; the shielding region is disposed on the side of the base substrate, and around at least a part of the outer contour of the alignment region, and non-overlapped with the peripheral region. The alignment region and the shielding region are opaque, and the peripheral region is transparent.

For example, a portion of the peripheral region disposed around the outer contour of the alignment region is at least partially surrounded by the shielding region.

For example, the alignment region is in a shape of a polygon.

For example, the peripheral region includes a plurality of strip structures, and the plurality of strip structures respectively extend along extending directions of sides of the outer contour of the alignment region, and lengths of the plurality of strip structures are each greater than a length of a corresponding side of the alignment region.

For example, the alignment region is in a shape of a circle.

For example, the peripheral region includes a plurality of strip structures, and the plurality of strip structures respectively extend along tangential directions of the alignment region, and lengths of the plurality of strip structures are each greater than a diameter of the alignment region.

For example, the substrate further includes a working area and a non-working area located at a periphery of the working area, and the alignment mark is located in the non-working area.

For example, the substrate is a mother board, the mother board includes a plurality of substrate units, and each substrate unit includes a black matrix that divide the working area of the substrate unit into a plurality of array units, and materials of the alignment region and the shielding region of the alignment mark are same as materials of the black matrix.

At least one embodiment of the present disclosure further provides a method of manufacturing the substrate, and the method includes: providing a base substrate; forming an opaque film layer on the base substrate; and patterning the opaque film layer to form an alignment region and a shielding region of the alignment mark.

For example, in the method of manufacturing the substrate, the opaque film layer is a black photosensitive film layer, and the patterning is achieved by an exposure-development process.

For example, in the method of manufacturing the substrate, the base substrate includes a working area and a non-working area located at a periphery of the working area. The substrate includes a black matrix, and the method of manufacturing the substrate further includes forming the black matrix in the working area of the base substrate. The alignment mark is formed simultaneously with the black matrix through a same process.

At least one embodiment of the present disclosure further provides an exposure alignment method, and the method includes: providing a substrate, an exposure machine, and a mask, wherein the substrate has a first alignment mark which is any alignment mark provided by the embodiments of the present disclosure formed thereon, and the mask includes a second alignment mark; obtaining, by the exposure machine, position information of an alignment region of the first alignment mark; and adjusting a relative position between the substrate and the mask to align the mask with the substrate.

For example, in the exposure alignment method, the exposure machine includes a lens, and the mask is located between the lens and the substrate, and image information of the shielding region of the alignment mark is acquired by the lens.

For example, in the exposure alignment method, the second alignment mark has an alignment center such that the position information of the alignment region of the first alignment mark is same as position information of the alignment center of the second alignment mark to achieve the alignment.

BRIEF DESCRIPTION OF THE DRAWINGS

In order to describe technical solutions in embodiments of the present disclosure more clearly, the accompanying drawings of the present disclosure will be introduced briefly. Obviously, the accompanying drawings to be described below merely refer to some embodiments of the present disclosure, and are not intended to limit the disclosure.

FIG. 7 is a flow diagram of a method of manufacturing a substrate, according to an embodiment of the present disclosure;

FIG. 8 is a flow diagram of a method of manufacturing another substrate, according to an embodiment of the present disclosure.

REFERENCE SIGNS

Figure 1:
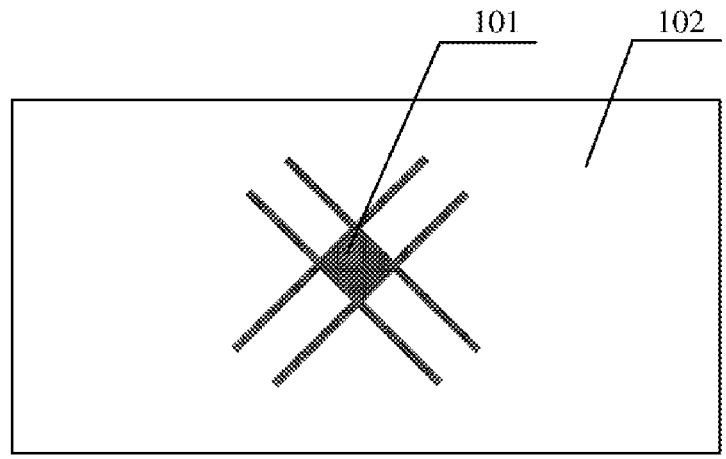
FIG. 1 is a schematic diagram of an alignment mark.

101—alignment region; 102—peripheral region; 103—disturbance object; 1—alignment region; 1001—outer contour of an alignment region; 2—peripheral region; 201—first strip structure; 202—second strip structure; 203—third strip structure; 204—fourth strip structure; 205—filler portion; 3—shielding region; 4—disturbance object; 5—substrate unit; 6—projection of an alignment mark on a substrate to be exposed; 7—base substrate; 8—working area; 9—non-working area; 10—alignment mark; 11—substrate; 12—array unit; 13—black matrix.

DETAILED DESCRIPTION

In order to make the objectives, technical solutions and advantages of embodiments of the present disclosure clearer, the technical solutions in the embodiments of the present disclosure will be described clearly and completely with reference to the accompanying drawings in the embodiments of the present disclosure. The described embodiments are merely some but not all of embodiments of the present disclosure. All other embodiments made on the basis of the described embodiments of the present disclosure by a person of ordinary skill in the art without paying any creative effort shall be included in the protection scope of the present disclosure.

Unless otherwise defined, technical terms or scientific terms used herein shall be understood as ordinary meanings by a person of ordinary skill in the field that the present disclosure belongs to. Words "first", "second" and other similar words used in the present disclosure are not intended to mean any order, quantity or importance, but are merely used to distinguish different components. A word "include", "comprise" or any other similar word is intended to mean that an element or object that precedes the word includes an element or object listed after the word and equivalents of the element or object, but other elements or objects are not excluded. A word "connect", "couple" or any other similar word is not limited to a physical or mechanical connection, but may include an electrical connection, whether direct or indirect. Words "Upper", "lower", "left", "right", etc. are only used to indicate a relative positional relationship, and when an absolute position of the described object is changed, the relative positional relationship may also be changed accordingly.

The dimensions of the drawings in the present disclosure are not strictly drawn in actual proportions, and the number of alignment marks and the number of array substrate units in a substrate are not limited to numbers shown in the drawings, and the specific dimensions and the number of the structures may be determined according to actual needs. The drawings described in the present disclosure are merely schematic structural diagrams.

It will be noted that position information of an alignment region of an alignment mark in the present disclosure refers to position information of any point in the alignment region. For example, in a case where the alignment region has a geometric center, the point is the geometric center. An alignment center of a second alignment mark in the present disclosure refers to a point selected by an exposure machine within a pattern of the second alignment mark. For example, in a case were the second alignment mark has a geometric center, the point may be the geometric center of the second alignment mark.

FIG. 1 is a schematic diagram of an alignment mark, which may be disposed on a substrate to be exposed and used for aligning the substrate to be exposed with a mask for exposure in an exposure process of the substrate to be exposed. The alignment mark includes an alignment region 101 and a peripheral region 102 around the alignment region 101. The alignment region 101 is opaque and the peripheral region 102 is transparent. The alignment mark is disposed on the substrate to be exposed, and the peripheral region 102 is a portion of the substrate to be exposed.

Figure 2:
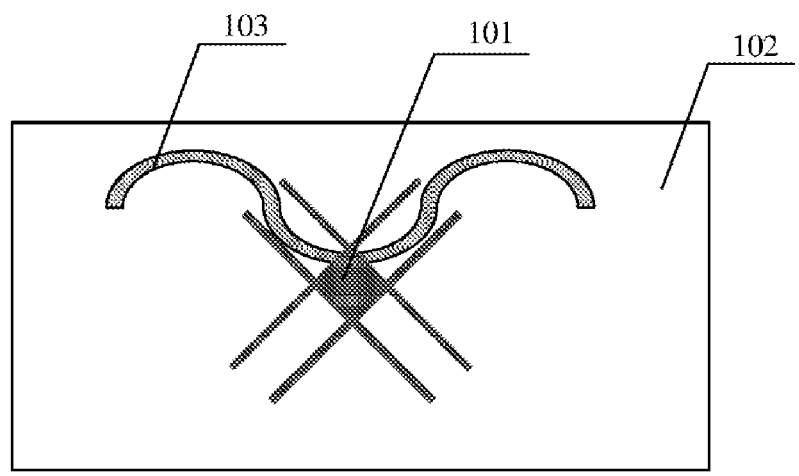
FIG. 2 is a schematic diagram of an exposure alignment performed by using the alignment mark shown in FIG. 1.

FIG. 2 is a schematic diagram of an exposure alignment performed by using the alignment mark shown in FIG. 1. An exposure machine includes a stage and a lens. The stage may be used to allow the substrate to be exposed to be placed thereon, and is movable. For example, the stage may be used to adjust a relative position between the substrate to be exposed and the lens. The lens may be used to obtain position information of the alignment mark. As shown in FIG. 2, in an exposure alignment process, in a case where there is a need to achieve an alignment of a mask and a substrate to be exposed, the substrate to be exposed provided with the alignment mark is generally placed on the stage, and the lens of the exposure machine is used to obtain the position information of the alignment region of the alignment mark on the substrate to be exposed. The lens generally identifies a position of the alignment region 101 by identifying a gray scale difference between the alignment region 101 and the peripheral region 102 of the alignment mark, thereby obtaining the position information of the alignment region 101. The position information is, for example, a position coordinate. The mask is disposed between the substrate to be exposed and the lens of the exposure machine, and the mask has a second alignment mark thereon. The exposure machine moves the substrate to be exposed by moving the stage, so that a position coordinate of the alignment region 101 of the alignment mark on the substrate to be exposed is the same as a position coordinate of the alignment center of the projection of the second alignment mark on the substrate to be exposed, thereby achieving the alignment of the substrate to be exposed and the mask.

As shown in FIG. 2, the alignment mark generally overlaps some components (e.g., concave-convex structures for anti-static) disposed on the stage of the exposure machine, and these components are collectively referred to as disturbance objects 103. In this case, since the peripheral region 102 is transparent, things on the other side of the substrate to be exposed may be seen through the peripheral region. Therefore, when the mask is aligned with the substrate to be exposed, an image seen through the lens is disturbed by the disturbance objects 103, thereby causing an error in identifying the position information of the alignment region 101 and an occurrence of alarms of "alignment error", which affects production and reduces production efficiency.

At least one embodiment of the present disclosure provides an alignment mark, and the alignment mark includes an alignment region, a peripheral region, and a shielding region. The alignment region has an outer contour. The peripheral region is disposed around at least a part of the outer contour of the alignment region. The shielding region is disposed around the outer contour of the alignment region, and is non-overlapped with the peripheral region. The alignment region and the shielding region are opaque, and the peripheral region is at least partially transparent.

The alignment mark provided by the embodiment of the present disclosure, for example, may be used to align an object to be exposed with a mask in an exposure process. For example, in the field of display, the alignment mark may be used to align a display substrate with the mask in a process of using the mask to exposure the display substrate during preparation. The display substrate, for example, may be an array substrate, a color film substrate, or the like. For example, the preparation of the color film substrate generally includes forming a black matrix and a plurality of pixel units in different colors by means of an exposure-development process performed by the exposure machine in cooperation with the mask. In this process, the alignment mark may be used to align the color film substrate in preparation with the mask. The alignment mark provided by the embodiment of the present disclosure may enable the exposure machine to obtain the position of the alignment mark more accurately, thereby improving the accuracy of the alignment between the substrate to be exposed and the mask. In addition, the alignment mark may reduce the number of alarms of alignment errors and improve the production efficiency.

Figure 3A:
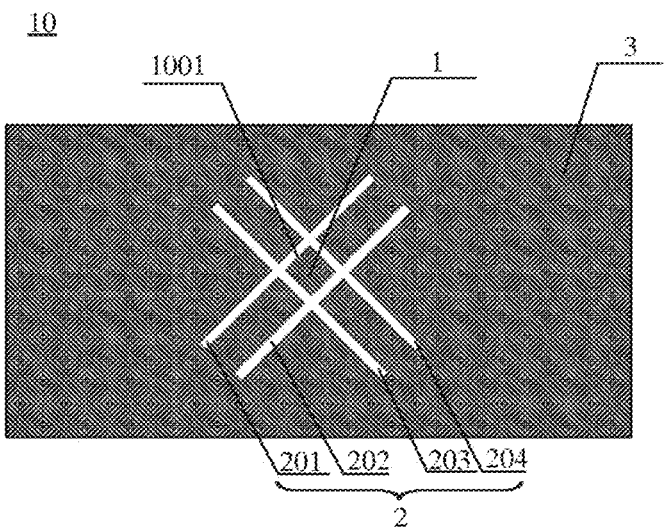
FIG. 3A is a schematic diagram of an alignment mark, according to an embodiment of the present disclosure.
Figure 3B:
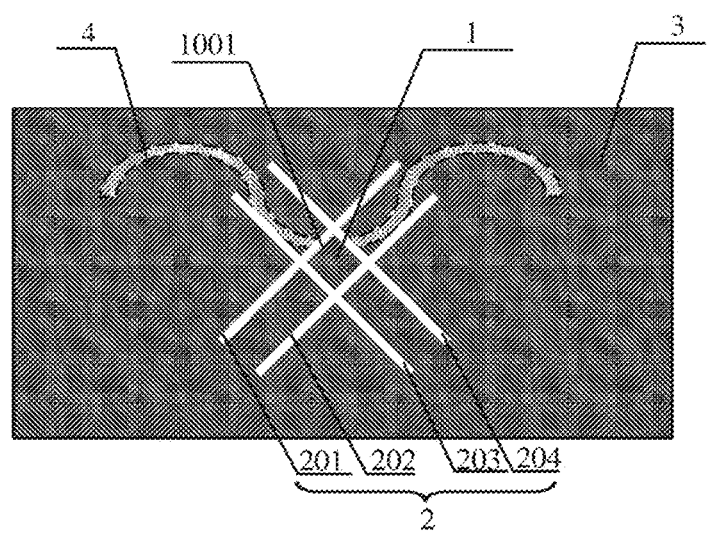
FIG. 3B is a schematic plan view showing a substrate provided with the alignment mark shown in FIG. 3A on a stage of an exposure machine.

For example, FIG. 3A is a schematic diagram of an alignment mark provided by an embodiment of the present disclosure, and FIG. 3B is a schematic plan view showing a substrate provided with the alignment mark shown in FIG. 3A on a stage of an exposure machine. As shown in FIG. 3A, the alignment mark 10 includes an alignment region 1, a peripheral region 2 and a shielding region 3. The alignment region 1 includes an outer contour 1001, and the peripheral region 2 is arranged around the outer contour 1001 of the alignment region 1. The alignment region 1 is opaque, while the peripheral region 2 is transparent. In this way, there may be a significant gray scale difference between the alignment region 1 and the peripheral region 2, which makes the position of the alignment region 101 be identified by means of the gray scale difference between the alignment region 1 and the peripheral region 2 manually or automatically identified through a lens in an exposure alignment process, thereby obtaining the position information of the alignment region of the alignment mark.

For example, the alignment region 1 and the shielding region 3 may be black. On one hand, compared to an alignment region 1 in any other color, the alignment region 1 in black may make a gray scale difference between the alignment region 1 in black and the peripheral region 2 more obvious. On the other hand, compared to a shielding region 3 in any other color, the shielding region 3 in black may have a better effect of shielding disturbance objects. In addition, in this way, it is beneficial for simplifying a process of manufacturing the substrate provided with the alignment mark 10.

For example, the alignment mark may be formed on the substrate to be exposed for aligning the substrate to be exposed with the mask. For example, the substrate to be exposed is transparent, and the peripheral region 2 of the alignment mark 10 may be a portion of the substrate to be exposed. Of course, in other embodiments, the peripheral region 2 may be partially transparent as well, as long as the alignment operation is not affected. The shielding region 3 is disposed around the outer contour 1001 of the alignment region 1 and is non-overlapped with the peripheral region 2. The shielding region 3 is opaque. As shown in FIG. 3B, during the exposure alignment, the substrate provided with the alignment mark 10 is placed on the stage of the exposure machine. When the alignment mark 10 overlaps a disturbance object 4 on the stage of the exposure machine, the shielding region 3 may shield the disturbance object 4, so that the disturbance object 4 may not be captured by the lens of the exposure machine, thereby preventing the disturbance object 4 from causing interference when the lens of the exposure machine captures an image of the alignment region 1 to obtain the position information of the alignment region. This makes the exposure machine obtain more accurate position information of the alignment mark 10, thereby improving the accuracy of the alignment of the substrate and the mask and reducing the number of alarms of alignment errors and improving the production efficiency.

It will be noted that disturbance objects 4 herein include any object that may be captured by the lens of the exposure machine if the object is not shielded by the shielding region 3. For example, the disturbance objects 4 are concave-convex structures for preventing static electricity from occurring between the substrate and the stage.

For example, the alignment region 1 is in a shape of a polygon. For example, the alignment region may be in a shape of a regular polygon or an irregular polygon. For example, the regular polygon includes a rectangle, an equilateral triangle, an isosceles triangle, a regular pentagon, an isosceles trapezoid, or the like. The irregular polygon includes a trapezoid, an irregular pentagon, or the like. For example, in an embodiment shown in FIG. 3A, the alignment region 1 is in a shape of a rectangle. Of course, examples in which the alignment region 1 is in the shape of a polygon are not limited to the above-listed cases, and the shape of the polygon is not limited in the embodiments of the present disclosure.

For example, the peripheral region may include a plurality of strip structures, and the plurality of strip structures respectively extend along extending directions of sides of the outer contour of the alignment region, and lengths of the plurality of strip structures are each greater than a length of a corresponding side of the alignment region. As shown in FIG. 3A, the alignment region 1 is in a shape of a rectangle, and the peripheral region 2 includes a first strip structure 201, a second strip structure 202, a third strip structure 203 and a fourth strip structure 204, which respectively extend along extending directions of sides of the rectangle, and lengths of which are each greater than a length of a corresponding side of the rectangle. In this way, the first strip structure 201, the second strip structure 202, the third strip structure 203, and the fourth strip structure 204 may form a light-transmitting region around the alignment region 1, so that the lens of the exposure machine may identify a significant gray scale difference between the alignment region 1 and the peripheral region 2 around the alignment region 1 when identifying the alignment region 1 in the exposure alignment process. Therefore, the alignment region 1 may be accurately identified, and accurate position information of the alignment region 1 may be obtained.

Figure 3C:
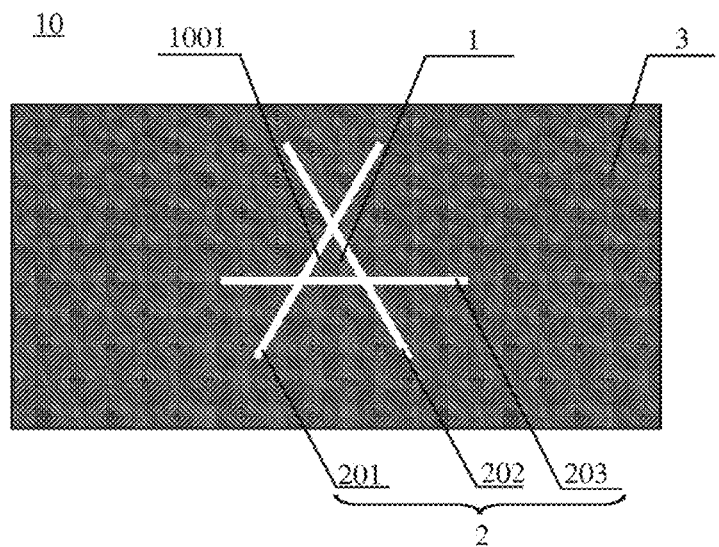
FIG. 3C is a schematic diagram of another alignment mark, according to an embodiment of the present disclosure.

In some examples, FIG. 3C is a schematic diagram of another alignment mark provided by an embodiment of the present disclosure. In the embodiment shown in FIG. 3C, the alignment region 1 is in a shape of a triangle, for example, an equilateral triangle. The peripheral region 2 includes a first strip structure 201, a second strip structure 202 and a third strip structure 203, which respectively extend along extending directions of sides of the triangle, and lengths of which are each greater than a length of a corresponding side of the triangle.

Figure 3D:
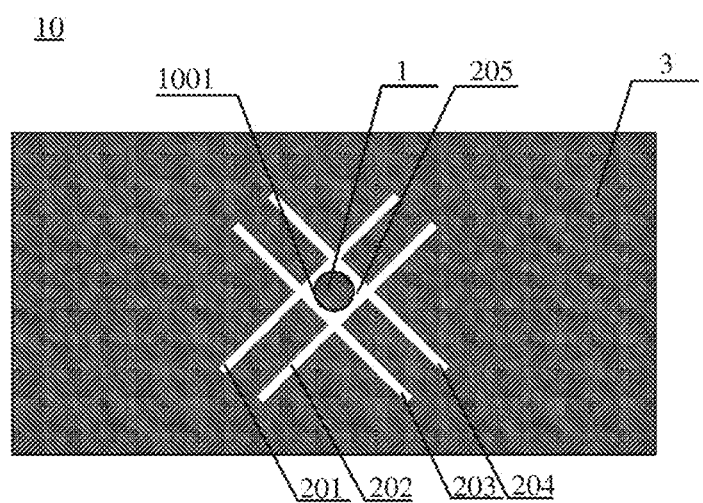
FIG. 3D is a schematic diagram of yet another alignment mark, according to an embodiment of the present disclosure.

For example, in another embodiment of the present disclosure, the alignment region may be in a shape of a circle as well. The peripheral region includes a plurality of strip structures, and the plurality of strip structures respectively extend along tangential directions of the alignment region, and lengths of the plurality of strip structures are each greater than a diameter of the alignment region. In an example, FIG. 3D is a schematic diagram of yet another alignment mark provided by an embodiment of the present disclosure. As shown in FIG. 3D, the alignment region 1 is in a shape of a circle. The peripheral region 2 includes a first strip structure 201, a second strip structure 202, a third strip structure 203, and a fourth strip structure 204, which respectively extend along tangential directions of the circle, and lengths of which are each greater than a diameter of the circle (i.e., the circumference of the circle). The peripheral region 2 of the alignment mark 10 further includes a filler portion 205 which is transparent, and the filler portion 205 is filled in an area between the alignment region 1 and the rectangle which is enclosed by the first strip structure 201, the second strip structure 202, the third strip structure 203, and the fourth strip structure 204. In this way, there may be a significant difference between a gray scale of the alignment region 1 and a gray scale of the peripheral region 2, which facilitates the lens of the exposure machine to accurately obtain position information of the alignment region 1. Of course, the number of strip structures is not limited to the number shown in FIG. 3D, and thus a pattern enclosed by the strip structures is not limited to the rectangle shown in FIG. 3D.

Figure 4A:
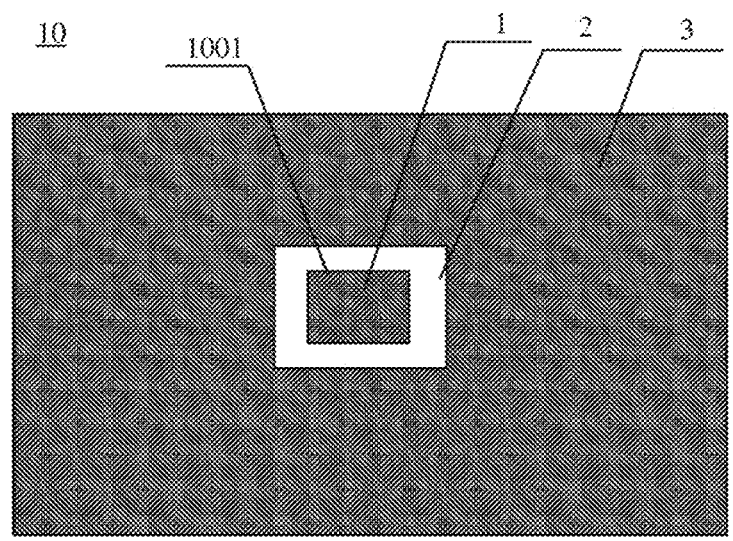
FIG. 4A is a schematic diagram of yet another alignment mark, according to an embodiment of the present disclosure.

For example, the peripheral region may be in a shape of a ring, and a shape of a contour of the ring is the same as the shape of the outer contour of the alignment region. In some examples, FIG. 4A is a schematic diagram of yet another alignment mark provided by an embodiment of the present disclosure. As shown in FIG. 4A, the alignment region 1 is in a shape of a rectangle, and the peripheral region 2 is in a shape of a rectangular ring surrounding the rectangle. This type of alignment mark 10 may also achieve the same technical effects as or similar technical effects to the technical effects of the embodiment shown in FIG. 3A.

Figure 4B:
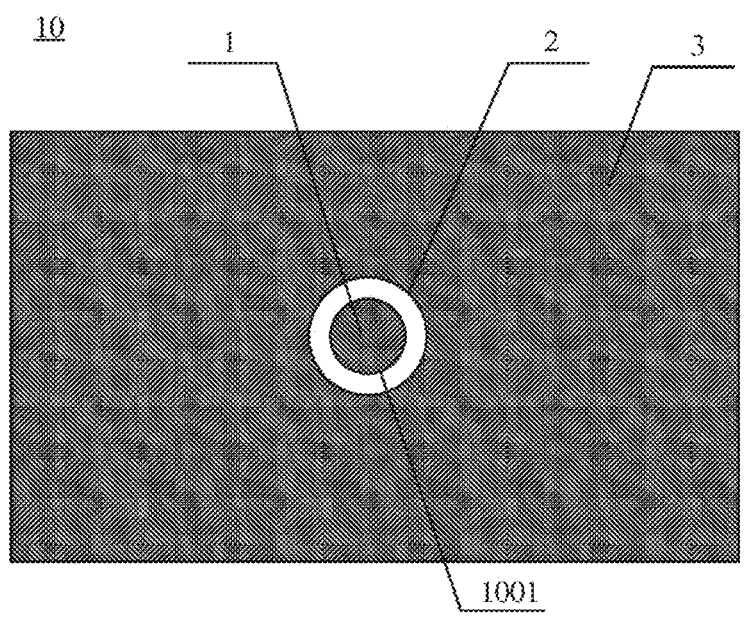
FIG. 4B is a schematic diagram of yet another alignment mark, according to an embodiment of the present disclosure.

In some examples, FIG. 4B is a schematic diagram of yet another alignment mark provided by an embodiment of the present disclosure. As shown in FIG. 4B, the alignment region 1 is in a shape of a circle, and the peripheral region 2 is in a shape of a circular ring surrounding the circle. This type of alignment mark 10 may also achieve the same technical effects as or similar technical effects to the technical effects of the embodiment shown in FIG. 3A.

It will be noted that, in the examples shown in FIGS. 4A and 4B, the peripheral region is in a shape of a closed ring. However, in other examples, the peripheral region may also be in a shape of a non-closed ring.

Figure 5:
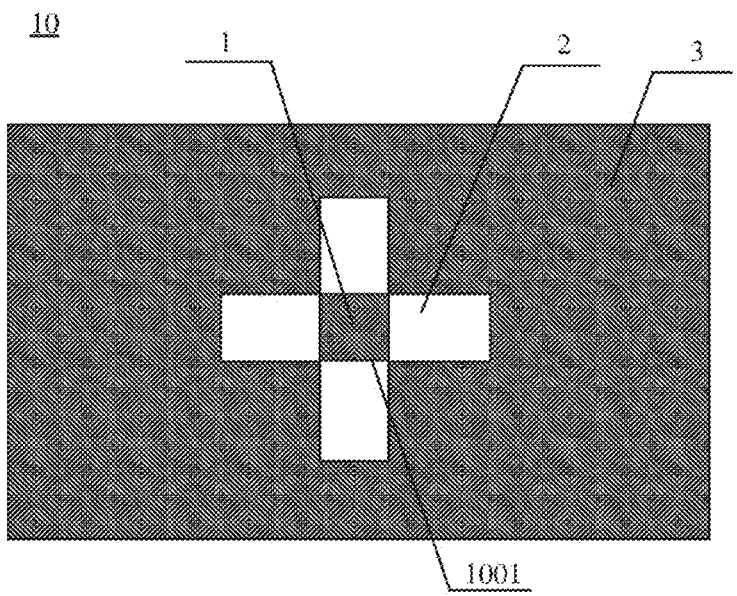
FIG. 5 is a schematic diagram of yet another alignment mark, according to an embodiment of the present disclosure.

For example, FIG. 5 is a schematic diagram of yet another alignment mark provided by an embodiment of the present disclosure. As shown in FIG. 5, the alignment region 1 is in a shape of a rectangle, and the peripheral region 2 includes four rectangular regions each disposed on a side of a corresponding side of the outer contour 1001 of the alignment region 1 away from the alignment region 1. This type of alignment mark 10 may also achieve the same technical effects as or similar technical effects to the technical effects of the embodiment shown in FIG. 3A.

It will be noted that alignment marks shown in FIG. 3A, FIG. 3C, FIG. 4A, FIG. 4B and FIG. 5 are only exemplary embodiments of the present disclosure, and alignment marks in the embodiments of the present disclosure are not merely limited to the types listed above.

As an example, materials of the alignment region and the shielding region may be photosensitive materials. For example, the photosensitive materials may include a photoresist material and a metal halide, such as a silver halide (e.g., AgCl or AgBr). The alignment region 1 and the shielding region 3 may be formed in an exposure-development process. The metal halide is a material with a low optical density before an exposure, and is decomposed to form metal particles after the exposure. The metal particles appear black since the particles are small, and have a high optical density value. In addition, for example, the photoresist material is a negative photoresist material, and it becomes insoluble in the developer after the exposure and remains, thereby forming a black alignment region and a black light-shielding region. The materials of the alignment region and the shielding region may also be materials in dark colors, such as black resin, metallic chromium or chromium oxide. Required patterns may be obtained through patterning methods such as printing or photolithography.

An embodiment of the present disclosure provides a substrate, and the substrate includes any alignment mark provided by the above embodiments of the present disclosure. The substrate may be aligned with a mask more accurately and efficiently in the exposure process.

Figure 6:
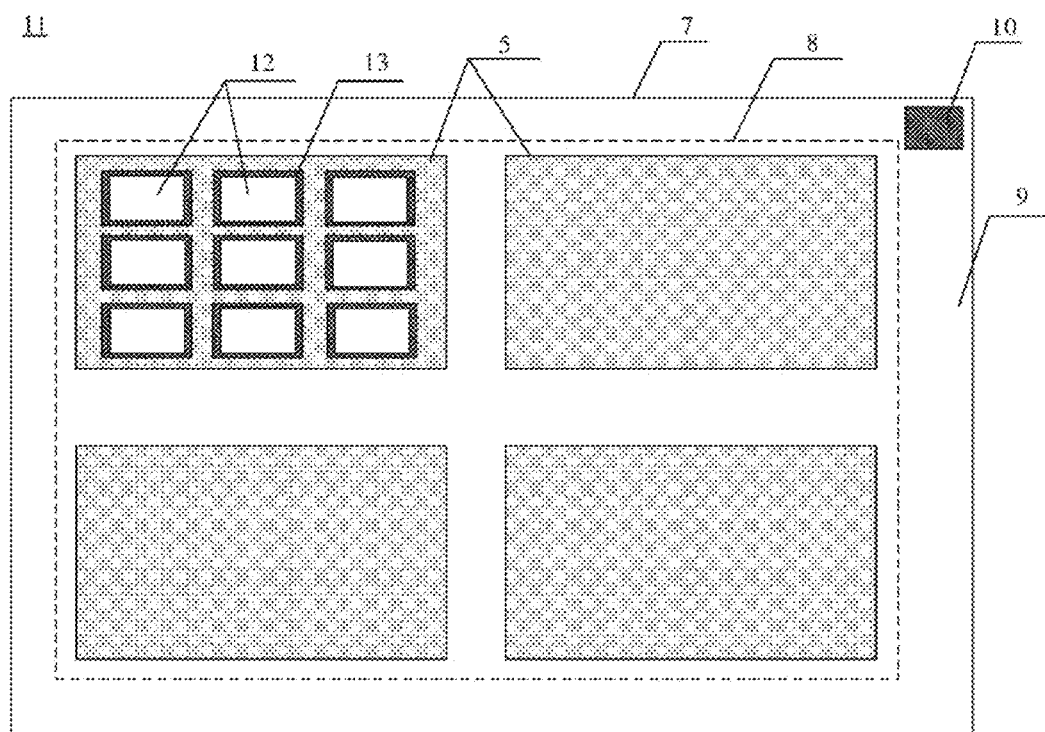
FIG. 6 is a schematic diagram showing a structure of a substrate, according to an embodiment of the present disclosure.

For example, FIG. 6 is a schematic diagram showing a structure of a substrate provided by an embodiment of the present disclosure. The substrate 11 includes any alignment mark 10 provided in the above embodiments of the present disclosure. For example, the substrate 11 includes a base substrate 7, and the base substrate 7 includes a working area 8 and a non-working area 9 located at a periphery of the working area 8. The alignment mark 10 is located in the non-working area 9. In an alignment process of the substrate and the mask before the substrate 11 is exposed, the substrate 11 is placed on a stage of an exposure machine. When the alignment mark 10 overlaps disturbance objects disposed on the stage of the exposure machine, the shielding region of the alignment mark may shield the disturbance objects, so that the disturbance objects may not be captured by a lens of the exposure machine, so as to prevent the disturbance objects from causing interference with position information of the alignment region obtained from an image of the alignment region which is captured by the lens of the exposure machine. This may make the exposure machine obtain more accurate position information of the alignment mark 10, thereby improving the accuracy of the alignment of the substrate 11 with the mask. In addition, the number of alarms of alignment errors is reduced, and the production efficiency is improved.

It will be noted that the number of the alignment marks 10 in the substrate 11 may be one or more, and the specific number of the alignment marks 10 may be determined according to actual needs.

For example, the substrate 11 may be a display substrate. As an example, as shown in FIG. 6, the substrate 11 may be a mother board, i.e., a mother board used in a process of manufacturing display substrates. The mother board includes a plurality of substrate units 5. Each substrate unit 5 includes a black matrix 13 which divides the substrate unit 5 into a plurality of array units 12.

For example, the substrate unit 5 may be a color film substrate, and the plurality of array units 12 divided by the black matrix 13 are a plurality of color pixel units. The materials of the alignment region and the shielding region of the alignment mark 10 may be the same as materials of the black matrix 13. For example, the materials of the black matrix may be photosensitive materials. For example, the photosensitive materials may include a photoresist material and a metal halide, such as a silver halide (e.g., AgCl or AgBr). Of course, the materials of the black matrix are not merely limited to the materials listed above, and those skilled in the art could refer to the conventional techniques in the art.

An embodiment of the present disclosure provides a method of manufacturing a substrate, and the substrate is any substrate provided by the embodiments of the present disclosure.

In some examples, FIG. 7 is a flow diagram of a method of manufacturing a substrate provided by an embodiment of the present disclosure. As shown in FIG. 7, the method includes: providing a base substrate, forming an opaque film layer on the base substrate, and patterning the opaque film layer to form an alignment region and a shielding region of an alignment mark. The base substrate includes a working area, and a non-working area located at a periphery of the working area.

For example, the opaque film layer is a black photosensitive film layer. As an example, materials of the opaque film layer may be photosensitive materials. For example, the photosensitive materials may include a photoresist material and a metal halide, such as a silver halide (e.g., AgCl or AgBr). As an example, the photoresist materials may be negative photoresist materials.

FIG. 8 is a flow diagram of a method of manufacturing another substrate provided by an embodiment of the present disclosure. For example, the substrate further includes a black matrix, and the method of manufacturing the substrate further includes forming the black matrix in the working area of the base substrate. For example, the substrate may be a mother board, i.e., a mother board used in a process of manufacturing display substrates. The mother board includes a plurality of substrate units. Each substrate unit includes a black matrix which divides the substrate unit into a plurality of array units. The black matrix divides each substrate unit into a plurality of array units. For example, the substrate unit may be a color film substrate, and the plurality of array units divided by the black matrix may be a plurality of pixel units. After the mother board is cut, a plurality of independent color film substrates may be obtained. The embodiment shown in FIG. 8 differs from the embodiment shown in FIG. 7 in that the alignment mark is formed simultaneously with the black matrix through a same process. The alignment region and the shielding region of the alignment mark, and the black matrix are formed while the opaque film layer is patterned. Materials of the alignment region and the shielding region of the alignment mark are the same as materials of the black matrix, and the materials are the materials of the above opaque film layer.

As an example, the opaque film layer may be patterned by an exposure-development process. For example, in a case where the materials of the opaque film layer contain a negative photoresist and/or a metal halide, cooperated with a mask, an exposure-development process is performed on the base substrate provided with an opaque film layer thereon. A portion of the opaque film layer for forming the peripheral region of the alignment mark is made not to be exposed to light, while a portion of the opaque film layer for forming the black matrix, the shielding region and the alignment region of the alignment mark are exposed to light. The metal halide is decomposed to form metal particles after the exposure, and the metal particles appear black since the particles are small. Moreover, the negative photoresist becomes insoluble in the developer after the exposure and remains, and thus the alignment region and the shielding region of the alignment mark, which are in black, and the black matrix may be simultaneously formed. In this method, the alignment mark and the black matrix are simultaneously formed through a same process, which simplifies the manufacturing process.

For example, in a case where the plurality of substrate units formed from the mother board are color film substrates, after the black matrix is formed to divide each substrate unit into a plurality of pixel units, there is still a need to form a plurality of color pixel units, such as, a red pixel unit, a green pixel unit, and a blue pixel unit, in each pixel unit. Generally, an exposure-development process may be performed on the color film substrate by using the mask to form the plurality of color pixel units. In the exposure process, the alignment mark may make the exposure machine obtain more accurate position information of the alignment mark, thereby improving the accuracy of the alignment of the substrate and the mask. In addition, the number of the alarms of the alignment errors is reduced, and the production efficiency is improved.

An embodiment of the present disclosure provides an exposure alignment method which includes: providing a substrate, an exposure machine, and a mask, wherein the substrate is provided with a first alignment mark which is any alignment mark provided by the embodiments of the present disclosure thereon, and the mask includes a second alignment mark; obtaining position information of the alignment region of the first alignment mark by using the exposure machine; and adjusting a relative position between the substrate and the mask to align the mask with the substrate.

Figure 9:
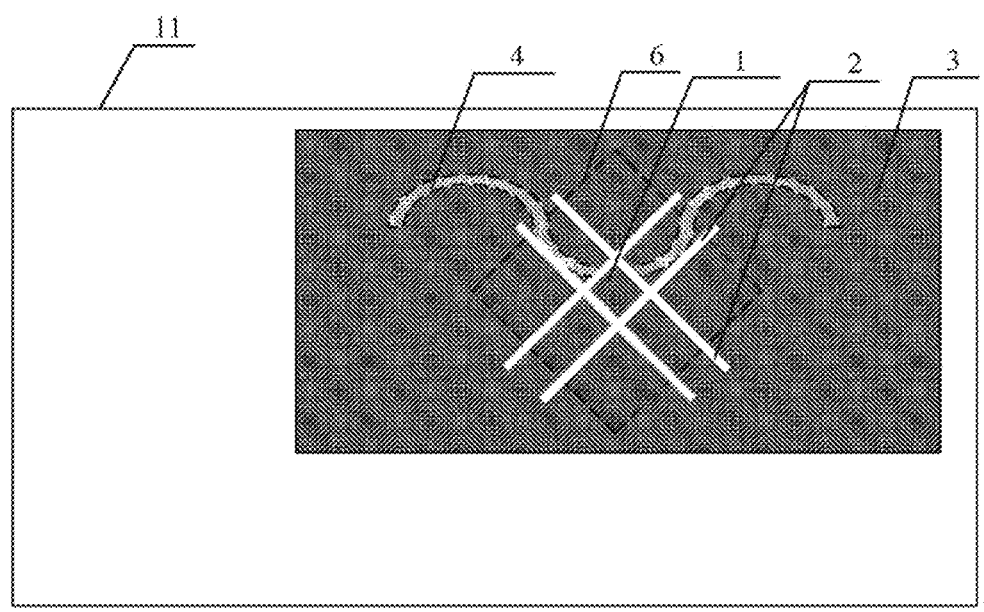
FIG. 9 is a schematic diagram of an exposure alignment method, according to an embodiment of the present disclosure.

In some examples, FIG. 9 is a schematic diagram of an exposure alignment method provided by an embodiment of the present disclosure, in which the aligning of the substrate provided with the alignment mark provided by embodiments of the present disclosure with the mask before an exposure is taken as an example. FIG. 9 shows only a part of the substrate 11. The substrate 11, an exposure machine, and a mask are provided. The mask includes the second alignment mark. As an example, the second alignment mark has an alignment center, and the position information of the alignment region of the first alignment mark is made to be the same as the position information of the alignment center of the second alignment mark to achieve an alignment. The exposure machine includes a stage and a lens, and the stage is movable. As shown in FIG. 9, during the alignment, the substrate 11 is placed on the stage of the exposure machine. The lens may be used to obtain position information of the first alignment mark. The lens of the exposure machine is used to obtain the position information of the alignment region 1 of the first alignment mark on the substrate 11. The lens identifies the alignment region 1 by identifying a gray scale difference between the alignment region 1 and the peripheral region 2 of the first alignment mark, thereby obtaining the position information of the alignment region 1. The position information is, for example, a position coordinate. The mask is disposed between the substrate 11 and the lens of the exposure machine, and an example where a projection 6 of the second alignment mark on the substrate to be exposed is regarded as the second alignment mark of the mask is shown in FIG. 9. The exposure machine moves the substrate 11 by moving the stage, so that the position information of the alignment region 1 of the first alignment mark on the substrate 11 is the same as the position information of the alignment center of the second alignment mark. The position information is position coordinates of the alignment region 1 of the first alignment mark and the alignment center of the second alignment mark in a plane parallel to the substrate 11. That is, in FIG. 9, a position coordinate of the alignment region 1 is the same as a position coordinate of the alignment center of the projection 6 of the second alignment mark on the substrate 11, which achieves the alignment of the substrate 11 and the mask.

As shown in FIG. 9, the first alignment mark on the substrate generally overlaps the disturbance object 4 disposed on the stage of the exposure machine. In this case, the shielding region 3 may shield the disturbance object 4, so that the disturbance object 4 may not be captured by the lens of the exposure machine, so as to prevent the disturbance object 4 from causing interference with position information of an alignment region obtained from an image of the alignment region which is captured by the lens of the exposure machine. This may make the exposure machine to obtain more accurate position information of the alignment mark, thereby improving the accuracy of the alignment of the substrate and the mask. In addition, the number of the alarms of alignment errors is reduced, and the production efficiency is improved.

The above descriptions are only exemplary embodiments of the present disclosure, but are not intended to limit the protection scope of the present disclosure. The protection scope of the present disclosure is defined by the appended claims.

What is claimed is:

1. An alignment mark, comprising:
   an alignment region having an outer contour;
   a peripheral region disposed around at least a part of the outer contour of the alignment region; and
   a shielding region disposed around at least a part of the outer contour of the alignment region and non-overlapped with the peripheral region, wherein
   the alignment region and the shielding region are opaque, and the peripheral region is at least partially transparent;
   the alignment region is in a shape of a polygon; and
   the peripheral region includes a plurality of strip structures, and the plurality of strip structures respectively extend along extending directions of sides of the outer contour of the alignment region, and lengths of the plurality of strip structures are each greater than a length of a corresponding side of the alignment region.

2. The alignment mark according to claim 1, wherein the alignment region is in a shape of a rectangle.

3. The alignment mark according to claim 1, wherein materials of the alignment region and the shielding region are photosensitive materials.

4. The alignment mark according to claim 1, wherein a portion of the peripheral region disposed around the outer contour of the alignment region is at least partially surrounded by the shielding region.

5. An alignment mark, comprising:
   an alignment region having an outer contour;
   a peripheral region disposed around at least a part of the outer contour of the alignment region; and
   a shielding region disposed around at least a part of the outer contour of the alignment region and non-overlapped with the peripheral region, wherein
   the alignment region and the shielding region are opaque, and the peripheral region is at least partially transparent;
   the alignment region is in a shape of a circle; and
   the peripheral region includes a plurality of strip structures, and the plurality of strip structures respectively extend along tangential directions of the alignment region, and lengths of the plurality of strip structures are each greater than a diameter of the alignment region.

6. The alignment mark according to claim 5, wherein materials of the alignment region and the shielding region are photosensitive materials.

7. The alignment mark according to claim 5, wherein a portion of the peripheral region disposed around the outer contour of the alignment region is at least partially surrounded by the shielding region.

8. A substrate, comprising:
a base substrate including a peripheral region;
an alignment region disposed on a side of the base substrate and having an outer contour, the peripheral region being disposed around at least a part of the outer contour of the alignment region; and
a shielding region disposed on the side of the base substrate, the shielding region being disposed around at least a part of the outer contour of the alignment region and being non-overlapped with the peripheral region, wherein
the alignment region and the shielding region are opaque, and the peripheral region is transparent;
the alignment region is in a shape of a polygon; the peripheral region includes a plurality of strip structures, and the plurality of strip structures respectively extend along extending directions of sides of the outer contour of the alignment region, and lengths of the plurality of strip structures are each greater than a length of a corresponding side of the alignment region; or
the alignment region is in a shape of a circle; the peripheral region includes a plurality of strip structures, and the plurality of strip structures respectively extend along tangential directions of the alignment region, and lengths of the plurality of strip structures are each greater than a diameter of the alignment region.

9. The substrate according to claim 8, wherein a portion of the peripheral region disposed around the outer contour of the alignment region is at least partially surrounded by the shielding region.

10. The substrate according to claim 8, comprising:
a working area and a non-working area located at a periphery of the working area, wherein
the alignment mark is located in the non-working area.

11. The substrate according to claim 8, wherein the substrate is a mother board, the mother board includes a plurality of substrate units, and each substrate unit includes a black matrix that divides the substrate unit into a plurality of array units; and
materials of the alignment region and the shielding region of the alignment mark are same as materials of the black matrix.

12. A method of manufacturing the substrate according to claim 8, the method comprising:
providing a base substrate;
forming an opaque film layer on the base substrate; and
patterning the opaque film layer to form the alignment region and the shielding region of the alignment mark; wherein
the opaque film layer is a black photosensitive film layer, and the patterning is achieved by an exposure-development process.

13. The method of manufacturing the substrate according to claim 12, wherein the base substrate includes a working area and a non-working area located at a periphery of the working area; the substrate includes a black matrix, and the method of manufacturing the substrate further comprises forming the black matrix in the working area of the base substrate; and
the alignment mark is formed simultaneously with the black matrix through a same process.

* * * * *

UNITED STATES PATENT AND TRADEMARK OFFICE
CERTIFICATE OF CORRECTION

PATENT NO. : 11,315,882 B2
APPLICATION NO. : 16/634741
DATED : April 26, 2022
INVENTOR(S) : Ma et al.

It is certified that error appears in the above-identified patent and that said Letters Patent is hereby corrected as shown below:

In the Specification

Column 1, Lines 8-13 under the "CROSS-REFERENCE TO RELATED APPLICATIONS", the paragraph should be listed as follows:
This application is a national phase entry under 35 USC 371 of International Patent Application No. PCT/CN2018/104655 filed on September 7, 2018, which claims priority to Chinese Patent Application No. 201711242791.9 filed on November 30, 2017, the contents of which are incorporated herein by reference to be a part of this application.

Signed and Sealed this
Twenty-eighth Day of June, 2022

Katherine Kelly Vidal
*Director of the United States Patent and Trademark Office*